(12) United States Patent
Sasaki et al.

(10) Patent No.: US 11,482,462 B2
(45) Date of Patent: Oct. 25, 2022

(54) POWER SEMICONDUCTOR DEVICE WITH FIRST AND SECOND SEALING RESINS OF DIFFERENT COEFFICIENT OF THERMAL EXPANSION

(71) Applicant: Mitsubishi Electric Corporation, Tokyo (JP)

(72) Inventors: Taishi Sasaki, Tokyo (JP); Yuki Yoshioka, Hyogo (JP); Hiroyuki Harada, Tokyo (JP); Yusuke Kaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 86 days.

(21) Appl. No.: 16/622,225

(22) PCT Filed: Aug. 25, 2017

(86) PCT No.: PCT/JP2017/030495
§ 371 (c)(1),
(2) Date: Dec. 12, 2019

(87) PCT Pub. No.: WO2019/038906
PCT Pub. Date: Feb. 28, 2019

(65) Prior Publication Data
US 2020/0194324 A1     Jun. 18, 2020

(51) Int. Cl.
*H01L 23/29* (2006.01)
*H01L 23/31* (2006.01)
(Continued)

(52) U.S. Cl.
CPC ............. *H01L 23/29* (2013.01); *H01L 23/31* (2013.01); *H01L 24/48* (2013.01); *H01L 25/04* (2013.01);
(Continued)

(58) Field of Classification Search
CPC ...................................................... H01L 23/29
(Continued)

(56) References Cited

U.S. PATENT DOCUMENTS

| 4,849,803 | A | * | 7/1989 | Yamamoto | ............. | H01L 23/24 |
| | | | | | | 257/687 |
| 5,753,536 | A | * | 5/1998 | Sugiyama | ............... | H01L 24/12 |
| | | | | | | 438/108 |

(Continued)

FOREIGN PATENT DOCUMENTS

| JP | S58-121652 A | 7/1983 |
| JP | H08-153833 A | 6/1996 |

(Continued)

OTHER PUBLICATIONS

An Office Action mailed by the Japanese Patent Office dated Apr. 28, 2020, which corresponds to Japanese Patent Application No. 2019-537521 and is related to U.S. Appl. No. 16/622,225.

(Continued)

*Primary Examiner* — Ajay Arora
(74) *Attorney, Agent, or Firm* — Studebaker & Brackett PC

(57) ABSTRACT

An object of the present invention is to suppress a crack in a sealing resin and a warpage in a semiconductor device in a power semiconductor device. A power semiconductor device includes: a semiconductor element; a terminal; a chassis; and a sealing resin sealing the semiconductor element and the terminal in the chassis. The sealing resin includes: a first sealing resin covering at least the semiconductor element; and a second sealing resin formed on an upper portion of the first sealing resin, and in an operation temperature of the semiconductor element, the first sealing resin has a smaller linear expansion coefficient than the second sealing resin, and a difference of a linear expansion coefficient between the first sealing resin and the terminal is (Continued)

smaller than a difference of a linear expansion coefficient between the second sealing resin and the terminal.

10 Claims, 6 Drawing Sheets

(51) Int. Cl.
  *H01L 23/00* (2006.01)
  *H01L 25/04* (2014.01)
(52) U.S. Cl.
  CPC .............. *H01L 2224/45124* (2013.01); *H01L 2924/181* (2013.01)
(58) Field of Classification Search
  USPC ........................................................ 257/678
  See application file for complete search history.

(56) References Cited

U.S. PATENT DOCUMENTS

| | | | |
|---|---|---|---|
| 2004/0007772 A1* | 1/2004 | Arai | H01L 23/3135 257/691 |
| 2007/0007280 A1* | 1/2007 | Bayerer | H01L 25/50 219/604 |
| 2014/0252325 A1* | 9/2014 | Kim | H01L 51/5259 257/40 |
| 2015/0076517 A1 | 3/2015 | Terai et al. | |

FOREIGN PATENT DOCUMENTS

| | | |
|---|---|---|
| JP | H10-270609 A | 10/1998 |
| JP | 2006-100320 A | 4/2006 |
| JP | 2009-302526 A | 12/2009 |
| JP | 2014-183302 A | 9/2014 |
| JP | 2015-027754 A | 2/2015 |
| JP | 2017-034152 A | 2/2017 |
| WO | 2013-111276 A1 | 8/2013 |

OTHER PUBLICATIONS

International Search Report issued in PCT/JP2017/030495; dated Oct. 10, 2017.

An Office Action; "Notice of Reasons for Refusal," mailed by the Japanese Patent Office dated Nov. 4, 2020, which corresponds to Japanese Patent Application No. 2019-537521 and is related to U.S. Appl. No. 16/622,225 ; with English language translation.

\* cited by examiner

POWER SEMICONDUCTOR DEVICE WITH FIRST AND SECOND SEALING RESINS OF DIFFERENT COEFFICIENT OF THERMAL EXPANSION

TECHNICAL FIELD

The present invention relates to a power semiconductor device and a method of manufacturing the power semiconductor device.

BACKGROUND ART

A conventional power semiconductor device includes a base plate, a case provided on the base plate, and a sealing resin filled in the case. Patent Document 1 describes a power semiconductor device in which a reinforcement plate made of a material of Cu or Fe is embedded in a base plate made of Al alloy, thereby reducing a linear expansion coefficient of the base plate and reducing a warpage of the base plate such that a rear surface thereof is convexed.

However, there are problems in the power semiconductor device in Patent Document 1 that cost increases by putting a different material in the base plate and thermal resistance decreases in a contact portion between the different materials.

PRIOR ART DOCUMENTS

Patent Documents

Patent Document 1: Japanese Patent Application Laid-Open No. 2006-100320

SUMMARY

Problem to be Solved by the Invention

Recently, a guarantee of operation at high temperature is required for a power semiconductor device. A difference of linear expansion coefficient between a sealing resin and an inner material sealed by the sealing resin causes stress applied to the sealing resin at high temperature, thereby generating a crack.

It is considered to raise a curing temperature of the sealing resin as a method of bringing the linear expansion coefficient of the sealing resin close to the linear expansion coefficient of the inner material to reduce the stress. However, when the curing temperature of the sealing resin is raised, an amount of cure contraction increases, thus there is a problem that the power semiconductor device significantly warps. As described above, there is a trade-off relationship between a crack reduction in the sealing resin and a warpage reduction in the power semiconductor device.

The present invention therefore has been made to solve the above problems, and it is an object of the present invention to achieve a crack reduction in a sealing resin and a warpage reduction in the semiconductor device in a power semiconductor device.

Means to Solve the Problem

A power semiconductor device according to the present invention includes a semiconductor element, a terminal bonded to an upper surface of the semiconductor element, a chassis housing the semiconductor element and the terminal, and a sealing resin sealing the semiconductor element and the terminal in the chassis. The sealing resin includes a first sealing resin covering at least the semiconductor element and a second sealing resin formed on an upper portion of the first sealing resin. In an operation temperature of the semiconductor element, the first sealing resin has a smaller linear expansion coefficient than the second sealing resin, and a difference of a linear expansion coefficient between the first sealing resin and the terminal is smaller than a difference of a linear expansion coefficient between the second sealing resin and the terminal.

Effects of the Invention

In the power semiconductor device according to the present invention, the sealing resin is made up of a first sealing resin covering at least the semiconductor element and a second sealing resin formed on an upper portion of the first sealing resin. In an operation temperature of the semiconductor element, it is set that the first sealing resin has a smaller linear expansion coefficient than the second sealing resin, and a difference of a linear expansion coefficient between the first sealing resin and the terminal is smaller than a difference of a linear expansion coefficient between the second sealing resin and the terminal. In the first sealing resin which easily influences the semiconductor element, the stress caused by the difference of the linear expansion coefficient with the terminal is smaller than that in the second sealing resin, thus the crack caused by the stress can be suppressed. The second sealing resin has the larger linear expansion coefficient than the first sealing resin, thus the curing temperature can be set low. Thus, the contraction amount in the second sealing resin at the time of thermal curing can be reduced, and a warpage of the power semiconductor device can be suppressed.

DESCRIPTION OF EMBODIMENT(S)

<A. Embodiment 1>
<A-1. Configuration>

Figure 1:
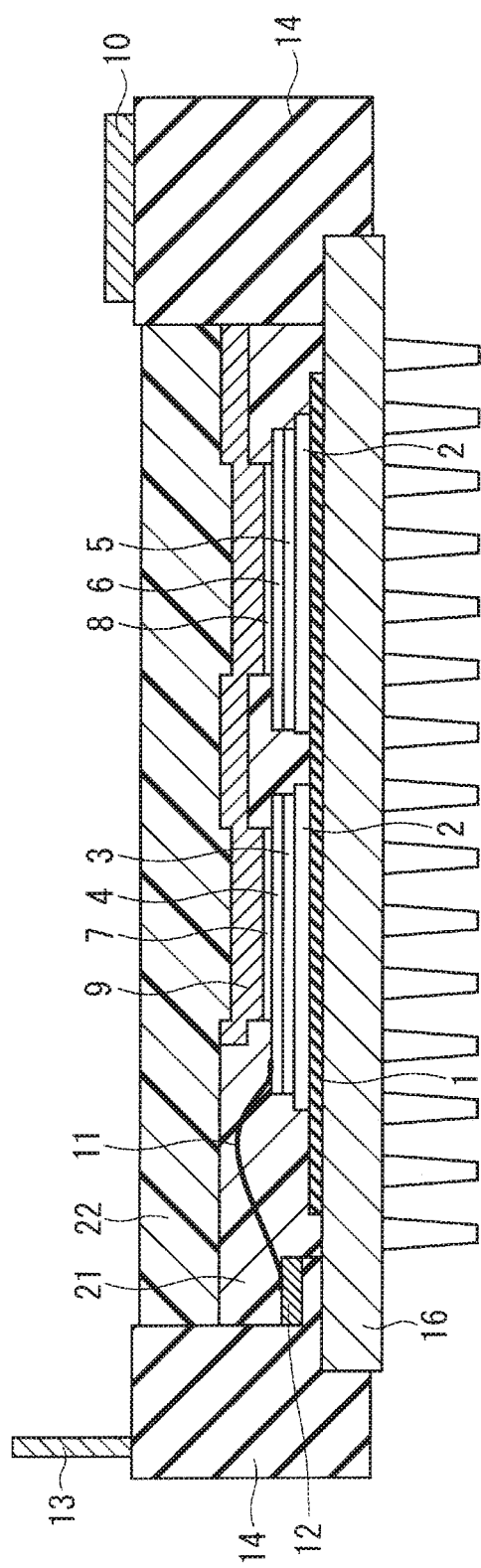
FIG. 1 A cross-sectional view illustrating a configuration of a power semiconductor device according to an embodiment 1.

FIG. 1 is a cross-sectional view illustrating a configuration of a power semiconductor device 101 according to the present embodiment. The power semiconductor device 101 is widely used for home electrical appliance, industry, automobile, and train, for example. The configuration of the power semiconductor device 101 is described with reference to FIG. 1.

The power semiconductor device 101 includes an insulating pattern 1, a conductive pattern 2, an IGBT chip 4, a diode chip 6, an inner frames 9 and 12, a main terminal 10, an aluminum wiring 11, a signal terminal 13, an insert case 14, and a radiation pin fin 16. The two conductive patterns 2 are formed on an upper surface of the insulating pattern 1, and the IGBT chip 4 and the diode chip 6, each of which is a semiconductor element, are bonded by solders 3 and 5 on these conductive patterns 2.

The inner frame 9 is bonded to an upper surface of the IGBT chip 4 by a solder 7, and is bonded to an upper surface of the diode chip 6 by a solder 8. The inner frame 9 is formed of copper, for example, and is the same member as the main terminal 10.

The aluminum wiring 11 is bonded to the upper surface of the IGBT chip 4. One end of the aluminum wiring 11 is bonded to the upper surface of the IGBT chip 4, and the other end thereof is bonded to the inner frame 12. The inner frame 12 is formed of copper, fir example, and is the same member as the signal terminal 13.

The radiation pin fin 16 is bonded to a lower surface of the insulating pattern 1. In other words, the insulating pattern 1 is provided between the conductive pattern 2 and the radiation pin fin 16, and insulates them from each other. The insulating pattern 1, the conductive pattern 2, the IGBT chip 4, the diode chip 6, the inner frames 9 and 12, and the aluminum wiring 11 are housed in the insert case 14. The insert case 14 is a chassis forming an outer shape of the power semiconductor device, and has an insulation function. The radiation pin fin 16 is exposed from a lower surface of the insert case 14, and serves as a radiation of the power semiconductor device 101.

An inner portion of the insert case 14 is filled with a sealing resin 21 which is a first sealing resin and a sealing resin 22 which is a second sealing resin. The sealing resin 21 is filled in a lower side of the inner portion of the insert case 14, and covers the IGBT chip 4 and the diode chip 6. The sealing resin 22 is filled in an upper side of the sealing, resin 21, that is to say, an upper side of the inner portion of the insert case 14. The sealing resin 21 has a lower linear expansion coefficient than the sealing resin 22 in a high temperature region ranging from 125° C. to 200° C. That is to say, when the linear expansion coefficient of the sealing resin 21 is expressed as al and the linear expansion coefficient of the sealing resin 22 is expressed as $\alpha 2$, there is a relationship of $\alpha 1 < \alpha 2$ in the high temperature region described above.

Figure 2:
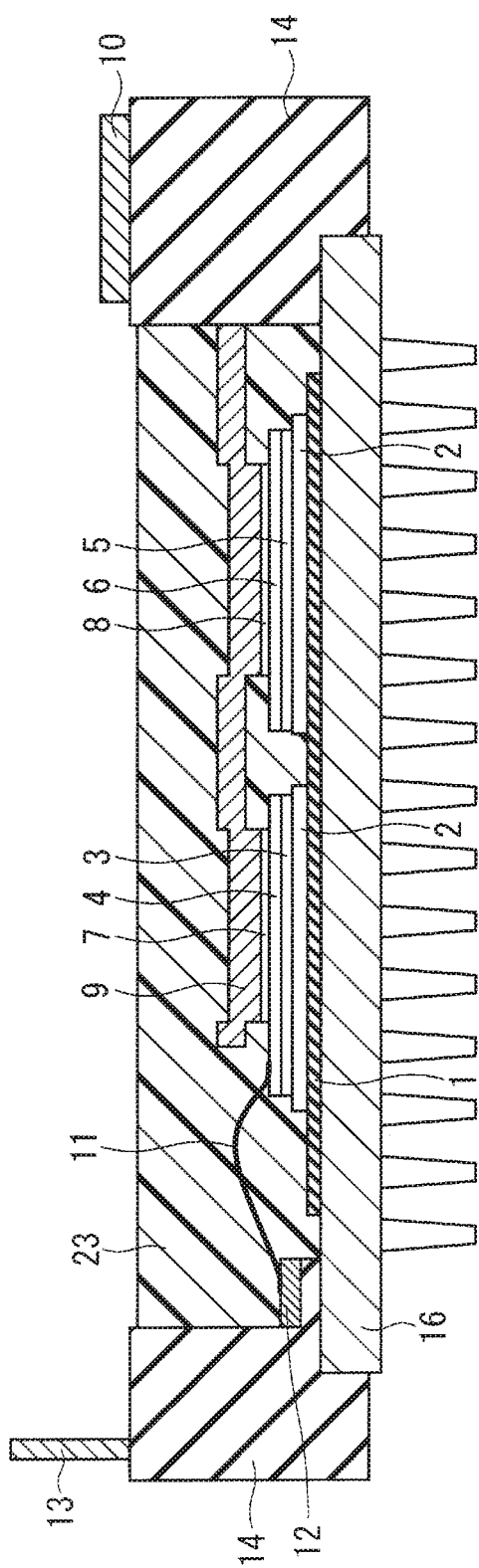
FIG. 2 A cross-sectional view illustrating a configuration of a power semiconductor device according to a comparison example.

FIG. 2 is a cross-sectional view illustrating a configuration of a power semiconductor device 101E according to a comparison example of the present embodiment. In the power semiconductor device 101E, the inner portion of the insert case 14 is filled with only one type of sealing region 23 instead of the sealing resins 21 and 22, and the power semiconductor device 101E is different from the power semiconductor device 101 only on this point.

Figure 3:
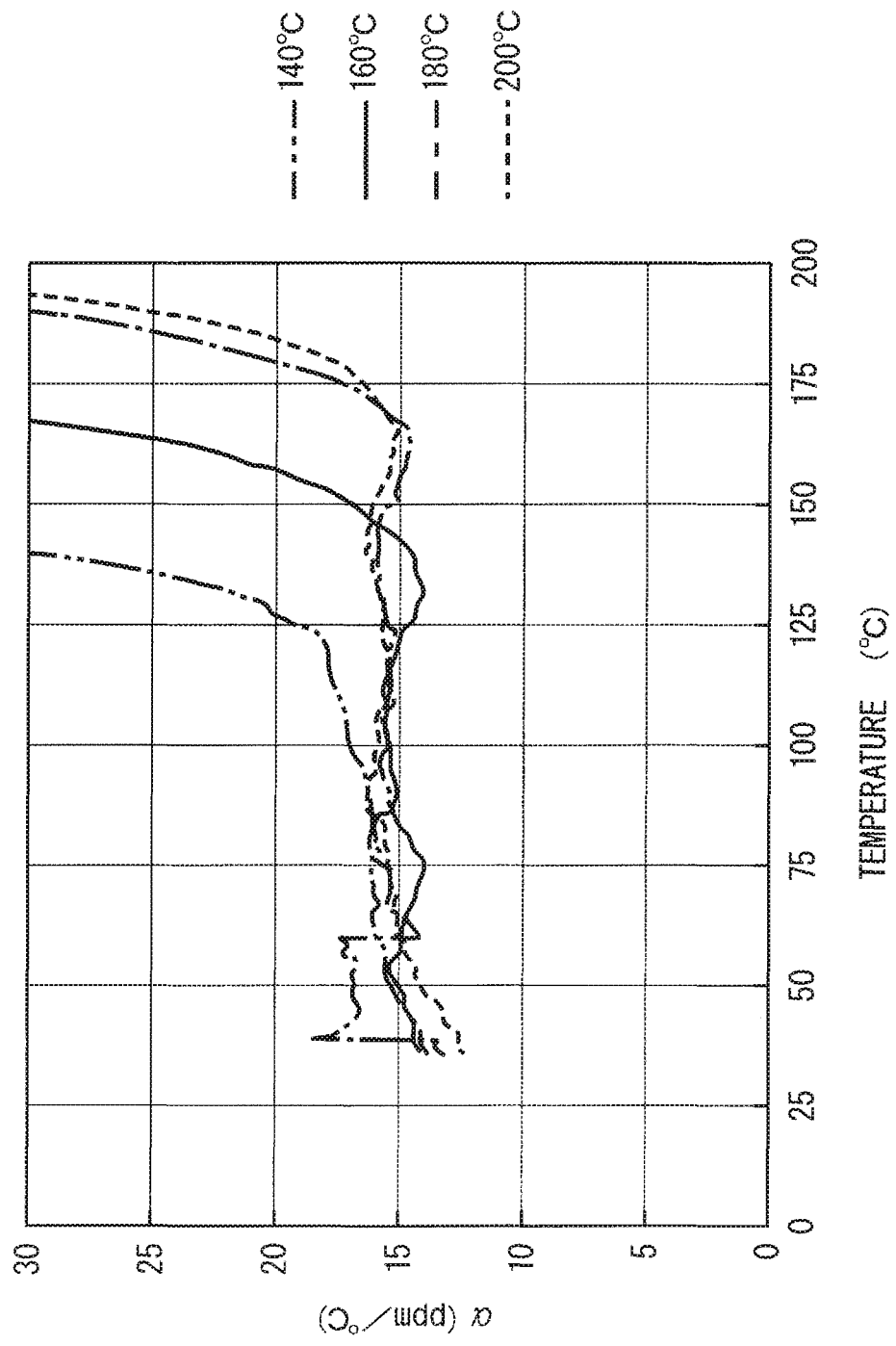
FIG. 3 A drawing illustrating temperature dependency of a linear expansion coefficient of a sealing resin for each curing temperature of the sealing resin.

FIG. 3 is a graph illustrating temperature dependency of the linear expansion coefficient of a sealing resin for each curing temperature of the sealing resin. A vertical axis indicates a linear expansion coefficient $\alpha$ (ppm/° C.), and a horizontal axis indicates a temperature (° C.). An alternate long and two short dashes line indicates characteristics of a sealing resin having a curing temperature 140° C., a solid line indicates characteristics thereof having a curing temperature 160° C., an alternate long and short dash line indicates characteristics thereof having a curing temperature 180° C., and a dashed line indicates characteristics thereof having a curing temperature 200° C.

Copper is generally used in the inner frame 9 which is sealed by the sealing resin 23 and bonded to the IGBT chip 4 and the diode chip 6 by the solders 7 and 8 in the power semiconductor device 101E. The reason is that copper has low electrical resistance, thereby reducing loss when current is applied in the power semiconductor device 101E. The linear expansion coefficient $\alpha$ of copper ranges from 16.5 to 18.3 (ppm/° C.), thus is approximately 17 (ppm/° C.) in a temperature range from 20° C. to 227° C.

The linear expansion coefficient of the sealing resin 23 having the curing temperature 140° C. is considered with reference to FIG. 3. When an operation temperature of the power semiconductor device is 125° C., the linear expansion coefficient of the sealing resin 23 ranges approximately from 17 to 20 (ppm/° C.), thus is substantially equal to the linear expansion coefficient of the inner frame 9 which is approximately 17 (ppm/° C.). Accordingly, little stress occurs in a contact portion between the sealing resin 23 and the inner frame 9.

However, SiC is currently adopted to the semiconductor element, for example, thus a guarantee of operation at high temperature is required for the power conductor device, and an upper limit of an operation guarantee range needs to be increased by 25° C. from conventional 125° C. to 150° C. Accordingly, when considered is a case where the operation temperature of the power semiconductor device 101E is 150° C., the linear expansion coefficient of the sealing resin 23 is 30 (ppm/° C.) which is larger than the linear expansion coefficient of the inner frame 9, that is approximately 17 (ppm/° C.), by 10 (ppm/° C.) or more. In this manner, when the two members having the different linear expansion coefficient come in contact with each other, the stress occurs, and as a result, a crack may occur in the sealing resin 23.

As a measure for this problem, it is efficient that the curing temperature of the sealing resin 23 is raised from 140° C. to 160° C. to reduce the difference of the linear expansion coefficient between the sealing resin 23 and the inner frame 9. When the operation temperature of the power semiconductor device 101E is 150° C., the linear expansion coefficient of the sealing resin 23 having the curing temperature 160° C. is around 17 (ppm/° C.), thus is substantially equal to the linear expansion coefficient of the inner frame 9 which is approximately 17 (ppm/° C.). Accordingly, the stress occurring due to the difference f the linear expansion coefficient can be reduced.

However, a thermoset resin is generally adopted to the sealing resin 23, thus there is a positive correlation between the curing temperature and a contraction amount at the time of thermal curing. For example, when the curing temperature of the sealing resin 23 is raised from 140° C. to 160° C., the contraction amount at the time of thermal curing also increases. As a result, there is a problem an amount of warpage of the power semiconductor device 101E such as the radiation pin fin 16 increases.

The power semiconductor device 101 illustrated in FIG. 1 simultaneously suppresses the crack in the sealing resin caused by the difference of the linear expansion coefficient and the warpage of the power semiconductor device due to the contraction of the sealing resin at the time of thermal curing.

Firstly, the curing temperature of the sealing resin 21 is raised higher than that of the sealing resin 22, thus the linear expansion coefficient of the sealing resin 21 is set to approximately 17 (ppm/° C.) in a high temperature region ranging from 125° C. to 200° C. In this manner, the linear expansion coefficient of the sealing resin 21 gets close to that of the inner frame 9, thus the crack in the sealing resin 1 due to the difference of the linear expansion coefficient can be suppressed.

The sealing resin 21 has the higher curing temperature than the sealing resin 22, thus the sealing resin 21 contracts to a larger degree than the sealing resin 22 at the time of thermal curing. However, the sealing resin 21 is provided on a lower position than a central portion of the power semiconductor device 101, thus the warpage of the power semiconductor device 101 due to the contraction of the sealing resin 21 can be suppressed. Herein, a central portion in a height direction from a lower surface to an upper surface of the inner frame 9 is defined as the central portion of the power semiconductor device 101.

The sealing resin 22 is provided on an upper position than the central portion of the power semiconductor device 101, but does not contract as much as the sealing resin 21 does at the time of thermal curing by reason that the sealing resin 22 has a lower curing temperature than the sealing resin 21. Accordingly, the warpage as the whole power semiconductor device 101 is suppressed.

The sealing resin 22 has the larger linear expansion coefficient than the inner frame 9 in the high temperature region ranging from 125° C. to 200° C., thus the stress caused by the difference of the linear expansion coefficient may occur. However, the sealing resin 22 does not directly cover the IGBT chip 4 and the diode chip 6, thus even when the crack occurs in the sealing resin 22, it has little influence on the IGBT chip 4 and the diode chip 6, thus reliability of the power semiconductor device 101 is maintained.

<A-2. Manufacturing Method>

A method of manufacturing the power semiconductor device 101 is described.

Firstly, the conductive pattern 2 is formed on the upper surface of the insulating pattern 1, and the IGBT chip 4 and the diode chip 6 are bonded to the conductive pattern 2 with the solders 3 and 5 therebetween.

Next, the inner frame 9 is bonded to the upper surface of the IGBT chip 4 with the solders 7 and 8 therebetween.

The radiation pin fin 16 is bonded to the lower surface of the insulating pattern 1.

Next, a bonded body of the radiation pin fin 16, the insulating pattern 1, the conductive pattern 2, the IGBT chip 4, the diode chip 6, and the inner frame 9 are housed in the insert case 14. At this time, a lower surface of the radiation pin fin 16 is exposed from the insert case 14.

Next, the inner frame 12 on a side of the signal terminal is formed on the insert case 14, and the upper surfaces of the inner frame 12 and the IGBT chip 4 are bonded by the aluminum wiring 11.

Subsequently, the insert case 14 is potted with the sealing resin 21 using a resin injection device. At this time, the insert case 14 is filled with the sealing resin 21 so that the sealing resin 21 covers at least the IGBT chip 4 and the diode chip 6. Furthermore, the sealing resin 21 covers an edge of the lower surface of the inner frame 9 to which the stress caused by the difference of the linear expansion coefficient is particularly applied, thus the occurrence of the crack by the stress caused by the difference of the linear expansion coefficient can be effectively suppressed.

It is preferable as illustrated in FIG. 1 that the whole aluminum wiring 11 is covered by the sealing resin 21. If the aluminum wiring 11 is sealed by both the sealing resin 21 and the sealing resin 22, the stress caused by the difference of the linear expansion coefficient between the sealing resin 21 and the sealing resin 22 is applied to the aluminum wiring 11. However, the sealing resin 21 covers the whole aluminum wiring 11, thus the stress described above can be prevented from being applied to the aluminum wiring 11.

Next, the sealing resin 21 is cured by heating. A first temperature which is the curing temperature of the sealing resin 21 herein is 140° C., for example, and is set lower than a second temperature which is the curing temperature of the sealing resin 22 described hereinafter.

Figure 4:
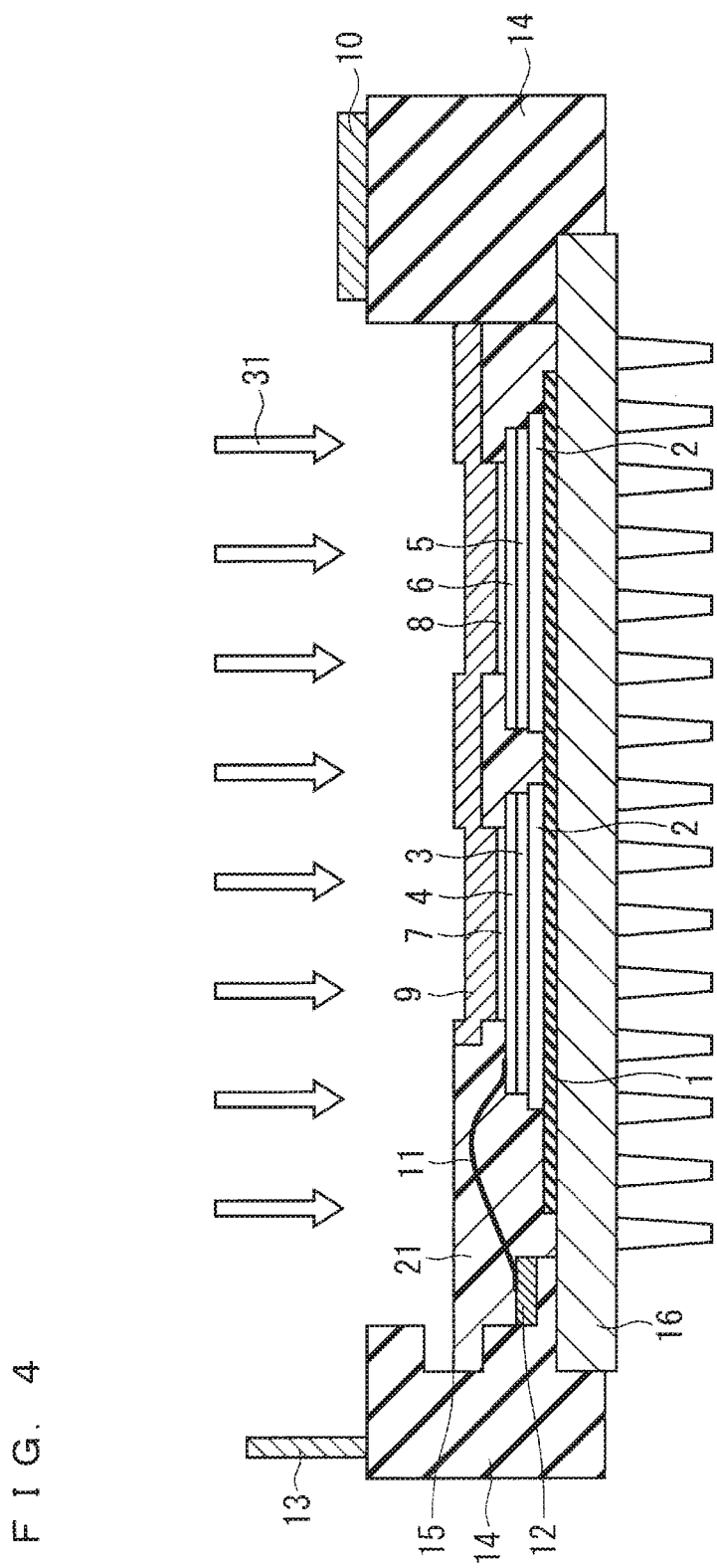
FIG. 4 A diagram explaining a step of manufacturing the power semiconductor device according to embodiment 1.

When copper is used in the inner frame 9, a surface layer of the inner frame 9 is oxidized by heat at the time of curing the sealing resin 21, thus bonding strength at a portion contacting the insert case 14 is reduced. Thus, after the sealing resin 21 is cured, as indicated by an arrow 31 in FIG. 4, UV radiation is performed on the upper surfaces of the sealing resin 21 and the inner frame 9. Accordingly, the bonding strength between the inner frame 9 and the insert case 14 increases, and the bonding strength between the sealing resins 21 and 22 also increases. As a result, the power semiconductor device 101 having high reliability can be obtained.

Subsequently, the insert case 14 is potted with the sealing resin 22 using a resin injection device, and an upper portion of the sealing resin 21 is filled with the sealing resin 22. Subsequently, the sealing resin 22 is cured by heating. The second temperature which is the curing temperature of the sealing resin 22 is 180° C., for example, and is set lower than the first temperature which is the curing temperature of the sealing resin 21. The power semiconductor device 101 is thereby completed.

<A-3. Effect>

As described above, the power semiconductor device 101 according to the embodiment 1 includes the IGBT chip 4 and the diode chip 6, each of which is the semiconductor element, the inner frame 9 which is the terminal bonded to the upper surface of the semiconductor element, the insert case 14 which is the chassis for housing the semiconductor element and the inner frame 9, and the sealing resin for sealing the semiconductor element and the inner frame 9 in the insert case. The sealing resin includes the sealing resin 21 which is the first sealing resin covering at least the semiconductor element and the sealing resin 22 which is the second sealing resin formed on the upper portion of the sealing resin 21. In the operation temperature of the semiconductor element, the sealing resin 21 has the smaller linear expansion coefficient than the sealing resin 22, and the difference of the linear expansion coefficient between the sealing resin 21 and the inner frame 9 is smaller than the difference of the linear expansion coefficient between the sealing resin 22 and the inner frame 9.

In this manner, the linear expansion coefficient of the sealing resin 21 covering the semiconductor element gets close to that of the inner frame 9, thus the stress applied to the sealing resin 21 caused by the difference of the linear expansion coefficient with the inner frame 9 can be reduced. Thus, the crack in the sealing resin 21 is suppressed. The sealing resin 22 having the larger linear expansion coefficient is provided on the upper portion of the sealing resin 21, thus the curing temperature of the sealing resin 22 can be made smaller than the sealing resin 21. Accordingly, the contraction amount in the sealing resin 22 at the time of thermal curing is made smaller than that of the sealing resin 21. As a result, the warpage of the power semiconductor device 101 can be reduced by 20% compared with a case of sealing the insert case 14 only with the sealing resin 21.

The stress caused by the difference of the linear expansion coefficient with the inner frame 9 is intensively applied around the edge of the lower surface of the inner frame 9 located on a side of the semiconductor element, and the crack easily occurs. Accordingly, in the power semiconductor device 101, the edge of the lower surface of the inner frame 9 is covered by the sealing resin 21, thus the crack in the sealing resin 21 by the stress caused by the difference of the linear expansion coefficient with the inner frame 9 can be effectively suppressed.

When copper is used in the inner frame 9 in the power semiconductor device 101, the linear expansion coefficient of copper is approximately 17 (ppm/° C.) in the temperature range from 20° C. to 227° C. When the curing temperature of the sealing resin 21 is set equal to or larger than 160° C., the linear expansion coefficient close to that of the inner frame 9 can be achieved at the operation temperature of 150° C. Accordingly, the crack in the sealing resin 21 caused by the difference of the linear expansion coefficient can be suppressed.

When the semiconductor element such as the IGBT chip 4 or the diode chip 6 is an SiC semiconductor element, the guarantee of operation at high temperature is required for the power semiconductor device 101. However, in the high temperature operation region, the linear expansion coefficient of the sealing resin 21 is made smaller than that of the sealing resin 22, and the difference of the linear expansion coefficient between the sealing resin 21 and the inner frame 9 is made smaller than the difference of the linear expansion coefficient between the sealing resin 22 and the inner frame 9, thus the stress applied to the sealing resin 21 is reduced, and the warpage of the whole power semiconductor device 101 can be suppressed.

The same material may be adopted to the sealing resin 21 and the sealing resin 22. When the same material is used, the resin injection device can be shared between the sealing resin 21 and the sealing resin 22, thus cost for installation of the resin injection device and a space for the resin injection device can be reduced. Accordingly, manufacturing cost of the power semiconductor device 101 can be reduced.

In the method of manufacturing the power semiconductor device 101 according to the embodiment 1, the inner frame 9 is bonded to the upper surface of the IGBT chip 4 and the diode chip 6, the IGBT chip 4, the diode chip 6, and the inner frame 9 are housed in the insert case 14, the IGBT chip 4 and the diode chip 6 in the insert case 14 is covered by the sealing resin 21 so that the upper surface of the inner frame 9 is exposed, the sealing resin 21 is cured at the first temperature, the sealing resin 22 is formed on the sealing resin 21 in the insert case 14, and the sealing resin 22 is cured at the second temperature which is lower than the first temperature.

According to the method of manufacturing the power semiconductor device 101 of the embodiment 1, the upper surface of the sealing resin 21 and the upper surface of the inner frame 9 are irradiated with UV after curing the sealing resin 21 and before forming the sealing resin 22. Accordingly, the bonding strength between the inner frame 9 and the insert case 14 increases, and the bonding strength between the sealing resins 21 and 22 increases, thus the power semiconductor device 101 having the high reliability can be obtained.

B. Embodiment 2

<B-1. Configuration>

Figure 5:
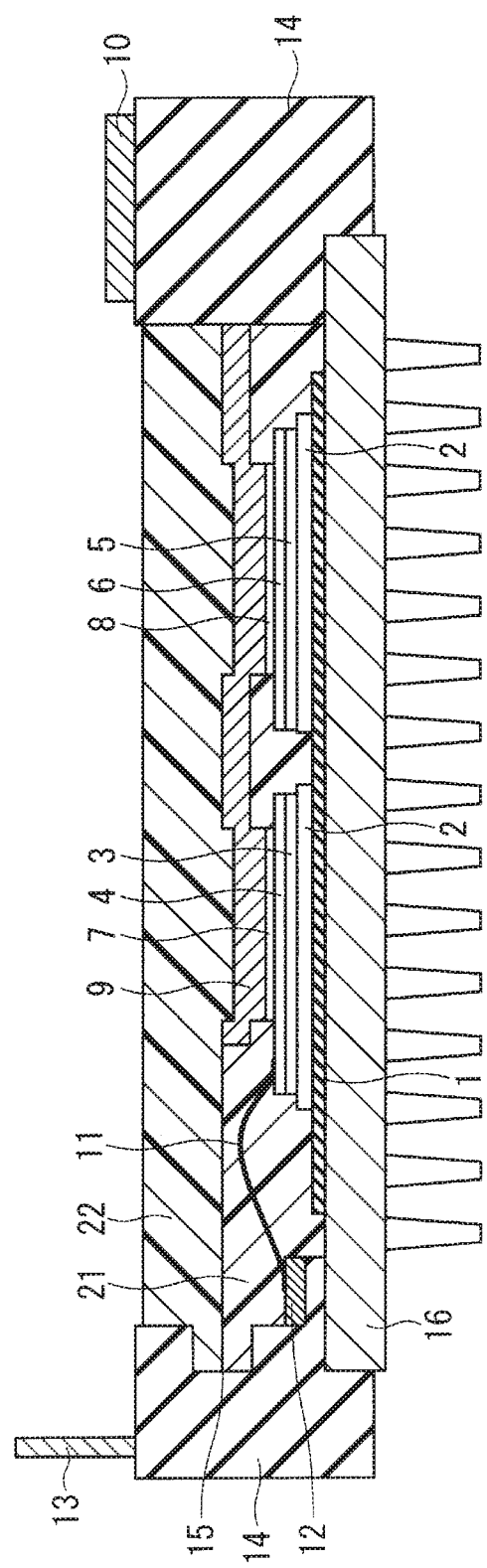
FIG. 5 A cross-sectional view illustrating a configuration of a power semiconductor device according to an embodiment 2.

FIG. 5 is a cross-sectional view illustrating a configuration of a power semiconductor device 102 according to an embodiment 2. In the power semiconductor device 102, an inner side surface of the insert case 14 has a concave portion 15. The configuration of the power semiconductor device 102 is similar to that of the power semiconductor device 101 according to the embodiment 1 on the other point.

In FIG. 5, the concave portion 15 is formed in a position over a boundary between the sealing resin 21 and the sealing resin 22, and both the sealing resin 21 and the sealing resin 22 are put into the concave portion 15 and formed. Accordingly, the sealing resin 21 and the sealing resin 22 are firmly bonded to the insert case 14 by anchor effect. As a result, even when the stress caused by the difference of the linear expansion coefficient between the sealing resins 21 and 22 occurs at high temperature, and interface debonding between the sealing resins 21 and 22 can be suppressed.

One of the sealing resin 21 and the sealing resin 22 may be put into the concave portion 15 and formed. Also in this case, the bonding between the sealing resin being put into the concave portion 15 and the insert case 14 is strengthened, thus as a result, the interface debonding between the sealing resins 21 and 22 by the stress caused by the difference of the linear expansion coefficient between the sealing resins 21 and 22 can be suppressed.

<B-2. Effect>

The power semiconductor device 102 according to the embodiment 2 has the concave portion 15 in the inner side surface of the insert case 14 which is the chassis. Thus, the bonding between the sealing resin being put into the concave portion 15 and the insert case 14 is strengthened, and the interface debonding between the sealing resins 21 and 22 is suppressed.

When both the sealing resins 21 and 22 are put into the concave portion 15 and formed, there is the anchor effect on both the sealing resins 21 and 22, and the sealing resins 21 and 22 are firmly bonded to the insert case 14, thus the interface debonding between the sealing resins 21 and 22 is further suppressed.

C. Embodiment 3

<C-1. Configuration>

Figure 6:
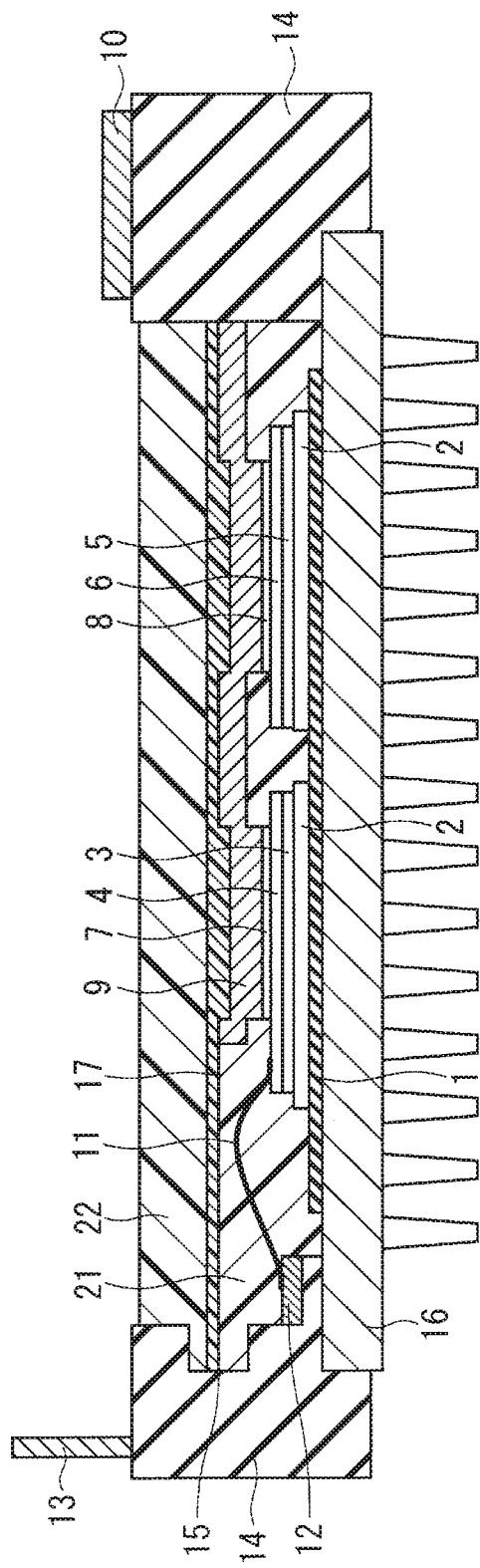
FIG. 6 A cross-sectional view illustrating a configuration of a power semiconductor device according embodiment 3.

FIG. 6 is a cross-sectional view illustrating a configuration of a power semiconductor device 103 according to an embodiment 3. The power semiconductor device 103 has a polyimide layer 17 between the sealing resin 21 and the sealing resin 22. The configuration of the power semiconductor device 103 is similar to that of the power semiconductor device 102 according to the embodiment 2 on the other point.

The polyimide layer 17 has a lower Vickers hardness than the cured sealing resins 21 and 22, thus absorbs the stress between the sealing resins 21 and 22. Thus, adhesion between the sealing resin 21 and the polyimide layer 17 and between the polyimide layer 17 and the sealing resin 22 can be increased. Accordingly, the power semiconductor device 103 having high reliability can be obtained.

<C-2. Effect>

The power semiconductor device 103 according to the embodiment 3 includes the polyimide layer 17 between the sealing resin 21 and the sealing resin 22, thus the adhesion between the sealing resin 21 and the polyimide layer 17 and between the polyimide layer 17 and the sealing resin 22 is increased, and the high reliability can be obtained.

According to the present invention, each embodiment can be arbitrarily combined, or each embodiment can be appropriately varied or omitted within the scope of the invention.

The present invention has been shown and described in detail, the foregoing description is in all aspects illustrative and not restrictive. Various modifications not exemplified are construed to be made without departing from the scope of the present invention.

EXPLANATION OF REFERENCE SIGNS 1 insulating pattern, 2 conductive pattern, 5, 7, 8 solder, 4 IGBT chip, 6 diode chip, 9, 12 inner frame, 10 main terminal, 11 aluminum wiring, 13 signal terminal, 14 insert case, 15 concave portion, 16 radiation pin fin, 17 polyimide layer, 21, 22, 23 sealing resin, 101, 101E, 102, 103 power semiconductor device

The invention claimed is:

1. A power semiconductor device, comprising:
a semiconductor element;
a terminal bonded to an upper surface of the semiconductor element;
a chassis housing the semiconductor element and the terminal; and
a sealing resin sealing the semiconductor element and the terminal in the chassis, the sealing resin including a first sealing resin covering at least the semiconductor element and a second sealing resin formed on and contacting an upper portion of the first sealing resin,
in an operation temperature of the semiconductor element, the first sealing resin has a smaller linear expansion coefficient than the second sealing resin, and a difference of a linear expansion coefficient between the first sealing resin and the terminal is smaller than a difference of a linear expansion coefficient between the second sealing resin and the terminal, and
the second sealing resin is positioned entirely to a side of the terminal opposite a side of the semiconductor element.

2. The power semiconductor device according to claim 1, wherein
the first sealing resin covers an edge of the terminal on the side of the terminal of the semiconductor element.

3. The power semiconductor device according to claim 1, wherein
the terminal is made of copper.

4. The power semiconductor device according to claim 1, wherein
the semiconductor element is an SiC semiconductor element.

5. The power semiconductor device according to claim 1, wherein
the first sealing resin and the second sealing resin are made of an identical material.

6. The power semiconductor device according to claim 1, further comprising:
an aluminum wiring connected to the semiconductor element, wherein
the aluminum wiring does not come in contact with the second sealing resin, but is covered by the first sealing resin.

7. The power semiconductor device according to claim 1, wherein
the chassis includes a bottom surface and an inner sidewall surface extending upwards from the bottom surface, and
the inner sidewall surface of the chassis has a concave portion.

8. The power semiconductor device according to claim 7, wherein
the first sealing resin and the second sealing resin are put into the concave portion and formed.

9. A power semiconductor device, comprising:
a semiconductor element;
a terminal bonded to an upper surface of the semiconductor element;
a chassis housing the semiconductor element and the terminal;
a sealing resin sealing the semiconductor element and the terminal in the chassis, the sealing resin including a first sealing resin covering at least the semiconductor element and a second sealing resin formed on an upper portion of the first sealing resin; and
a polyimide layer between the first sealing resin and the second sealing resin,
in an operation temperature of the semiconductor element, the first sealing resin has a smaller linear expansion coefficient than the second sealing resin, and a difference of a linear expansion coefficient between the first sealing resin and the terminal is smaller than a difference of a linear expansion coefficient between the second sealing resin and the terminal, and
the second sealing resin is positioned entirely to a side of the terminal opposite a side of the semiconductor element.

10. The power semiconductor device according to claim 2, wherein
the terminal is a one-piece member configured to provide a direct electrical path for current from an exterior of the power semiconductor device to an interior of the semiconductor element.

* * * * *